United States Patent [19]

Faris

[11] Patent Number: 5,786,629

[45] Date of Patent: Jul. 28, 1998

[54] 3-D PACKAGING USING MASSIVE FILLO-LEAF TECHNOLOGY

[75] Inventor: Sadeg Mustafa Faris, Pleasantville, N.Y.

[73] Assignee: Reveo, Inc., Hawthorne, N.Y.

[21] Appl. No.: 626,971

[22] Filed: Apr. 3, 1996

Related U.S. Application Data

[63] Continuation of Ser. No. 882,697, May 14, 1992, abandoned.

[51] Int. Cl.$^6$ .................................................. H01L 23/02
[52] U.S. Cl. ........................... 257/686; 257/685; 257/723; 257/724
[58] Field of Search ..................... 257/686, 685, 257/723, 724

[56] References Cited

U.S. PATENT DOCUMENTS

| | | |
|---|---|---|
| 4,525,921 | 7/1985 | Carson et al. |
| 4,764,846 | 8/1988 | Go |
| 4,983,533 | 1/1991 | Go |
| 5,099,488 | 3/1992 | Ahrabi et al. |
| 5,239,187 | 8/1993 | Schuhl et al. |
| 5,376,825 | 12/1994 | Tukamoto et al. ............ 257/685 |
| 5,473,198 | 12/1995 | Hagiya et al. ................ 257/686 |
| 5,502,333 | 3/1996 | Bertin et al. .................. 257/685 |
| 5,652,462 | 7/1997 | Matsunaga et al. .......... 257/686 |

*Primary Examiner*—Mahshid D. Saadat
*Assistant Examiner*—S. V. Clark
*Attorney, Agent, or Firm*—Thomas J. Perkowski

[57] ABSTRACT

This invention relates to a three-dimensional package or module which includes a large number of subassemblies or fillo-leafs arranged in a stack. The subassemblies which carry integrated circuits are bonded at one of their edges so they extend cantilever fashion into a fluid coolant. Each fillo-leaf includes a heat dissipating element and one is spaced from another by an ultraviolet light cured material which is in registry with a transparent edge portion of each fillo-leaf. The transparent edge portions are formed, on the wafer level, and used, on the wafer level to cure the U.V. curable material.

Pairs of encoder lines which are used to provide a unique address extend from the edge of each fillo-leaf to an associated comparator. When stacks of fillo-leafs are diced from a stack of wafers, the pairs of encoder lines are encoded by shorting or not shorting the exposed ends of encoder lines which extend from the edge of each fillo-leaf.

46 Claims, 3 Drawing Sheets

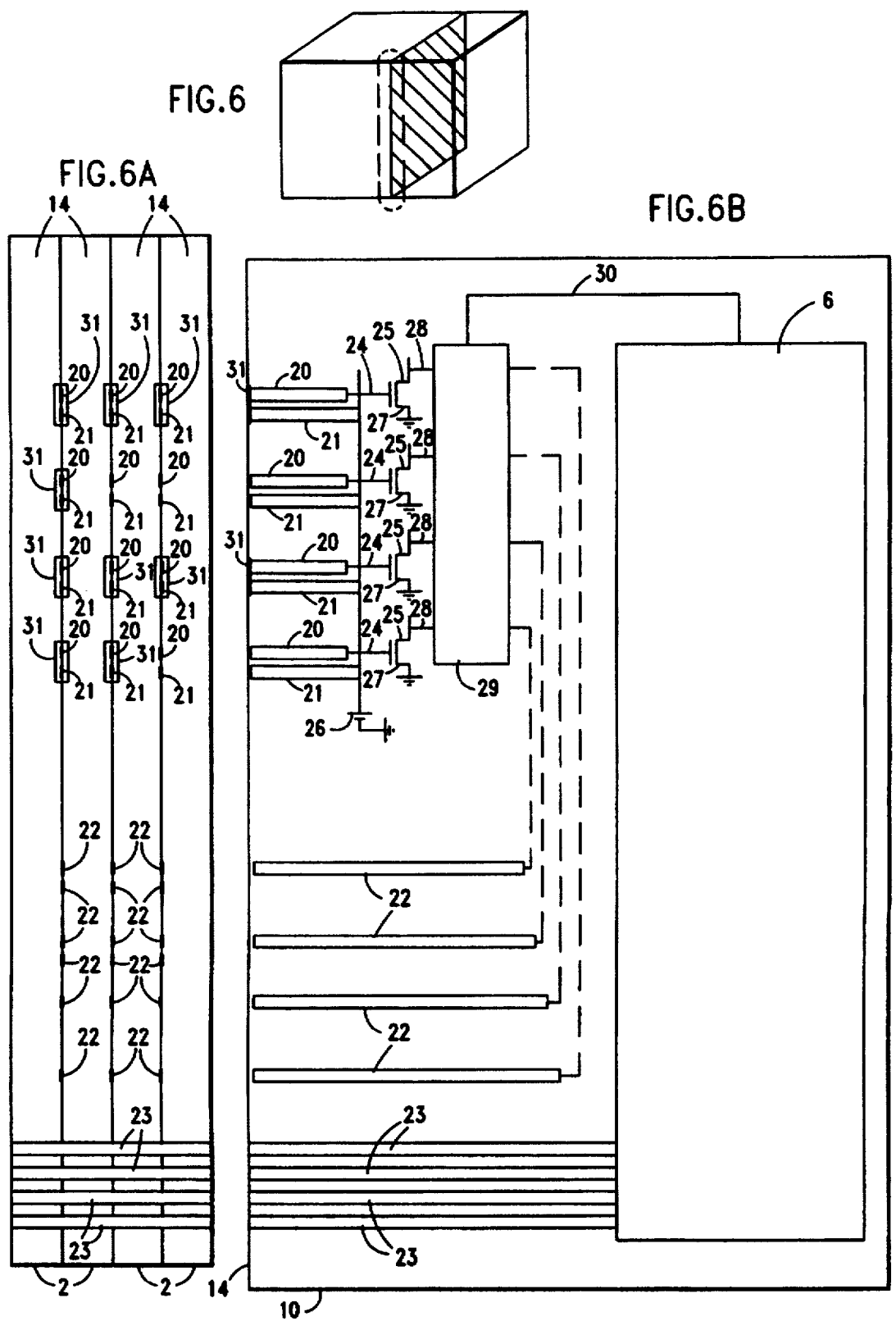

3-D PACKAGING USING MASSIVE FILLO-LEAF TECHNOLOGY

This patent application is a Continuation of application Ser. No. 07/882,697, filed May 14, 1992 now abandoned.

BACKGROUND OF THE INVENTION

1. Field of the Invention

The present invention relates generally to packages for integrated circuits and, more particularly, to a three-dimensional package which incorporates flexible or rigid semiconductor fillo-leafs or elements on which integrated circuits in the form logic circuits or memory arrays are disposed and their fabrication method. The fillo-leafs are bonded at an edge portion by means of ultra-violet light cured material and all interconnection lines terminate at the outer edge of the same edge portions. Pairs of strapped interconnection lines identify each fillo-leaf with its own code to permit selection of circuits or arrays on the semiconductor fillo-leaf. Other interconnections carry address information, data and power to these circuits. The modules are fluid cooled and may be ganged together to permit massively parallel data processing.

The fabrication method includes the formation of transparent edge portions on fillo-leafs so that, upon stacking, ultra-violet light curable material is fixed to bond fillo-leafs together. Also included is the step of encoding each fillo-leaf to provide each one with its own unique address.

2. Description Of Prior Art

Packages today are largely two-dimensional. Typically, multiple chips are placed on a single planar module called Multiple Chip Module (MCM). These modules are coarse in granularity, with feature sizes of 5 to 10 mils. Because of this coarse granularity, many metal levels are needed to wire the module. Typically, this category involves twenty to forty levels of metallization.

To reduce the number of metal layers, and thereby improve performance, newer 2-D modules use finer features such as thin film wiring with line widths on the order of 10 to 20 μm. A typical arrangement is to place four chips on a single module to comprise a single micro-processor (MP). One chip is the computer (CPU), one chip is the storage control unit (SCU), while the remaining two chips are the cache memory. The average chip has dimensions about 10 mm×10 mm. To allow for reasonable wiring, the module is likely to be 40 mm×40 mm. Even if placement algorithms are used to arrange chips and the function on the chips, typical chip-to-chip signal paths are of the order of the chip size, say 10 mm. For a transmission line of 15 μm width and lengths greater than 10 mm, line resistance becomes important and wiring rules are needed to restrict the signal length to achieve reasonable delays. Note that the signal path length to main memory is much larger.

The fastest micro-processors using MCM are now about 5 NS cycle time. It is becoming increasingly evident that 2-D MCM will not achieve significant improvements beyond 5 NS, making newer concepts extremely attractive.

A number of companies are involved in 3-D packaging. Several utilize a stacked tape-automated bonding (TAB) approach, which has significant limitations in that the number of vertically stacked chips is less than 20.

One approach to 3-D packaging is shown in U.S. Pat. No. 4,525,921, filed Jul. 25, 1983 and titled "High-Density Electronic Processing Package-Structure and Fabrication". This reference shows a high density electronic package module which comprises a stack of semiconductor chips having integrated circuitry on each chip. To permit the emplacement of thin film circuitry on the access ends, access plane is etched to cut back the semiconductor material and then covered with passivation material. It is thereafter lapped to uncover the ends of electrical leads on the chips. The leads are then connected to end plane wiring which is formed on two edges of stacked semiconductor chips. Chips are stacked in a supporting frame and bonded together using a thermally cured epoxy all of which remains disposed between pairs of chips. In the arrangement shown, conductors which extend from the stacked chips extend beyond the ends of the chips by etching back the semiconductor material. The exposed ends are then covered with passivation material in the absence of any bonding means. Bonding in the reference takes place over the whole surface of two semiconductor chips. The passivation or oxide material disposed over the end of an interconnection performs no window function but acts solely to support the interconnections when they extend beyond the semiconductor material. The reference also differs from the approach of the present application in that a planar surface does not appear to be required for end plane wiring. In addition, there is no indication that semiconductor elements extent in cantilevered fashion from cured bonding means at the edge of the semiconductor element.

U.S. Pat. No. 4,764,846 filed Jan. 5, 1987 entitled "High Density Electronic Package Comprising Stacked Sub-Modules" discloses a high density electronic package in which a stack of layer like sub-modules have their edges secured to a stack-carrying substrate. The latter is in a plane perpendicular to the planes in which the sub-modules extend. Each sub-module has cavity, inside which one or more chips are located. Each cavity-providing sub-module may be formed by either by securing a rectangular frame to a chip-carrying substrate or by etching a cavity in a single piece of material. In the latter case, chips are mounted on the flat surface of one sub-module, and located inside the cavity of the next sub-module. In this reference, an electronic module is formed by first constructing a plurality of individual chip carriers, each of which has a chip mounted in a cavity in the carrier. Then, the chip carriers are secured together in a laminated stack, and the stack as a unit, is secured to a wiring board or stack carrying substrate. In this reference, the semiconductor element or chip is disposed on a chip carrier or substrate and is connected to wiring which lies in a plane parallel to the plane of the chip. Thus, in the reference chips are placed on substrates which are then placed in chip carriers and the chip carriers are stacked to form a module. As such, there is no requirement for a transparent window for bonding means in registry with it disposed between pairs of semiconductor elements. Indeed, to the extent that semiconductor chips of the reference are bonded to a substrate, they assume the rigidity of the underlying substrate. Further, there is no hint or suggestion that encoding of individual chips can be accomplished using pairs of encoding conductors.

U.S. Pat. No. 4,706,166 filed Apr. 25, 1986 entitled "High-Density Electronic Modules-Process and Product" discloses a high density electronic module. The module is formed by stacking integrated circuit chips each of which carries integrated circuitry. The chips are glued together with their leads along one edge so that all the leads of the stack are exposed on an access plane. Bonding bumps are formed at appropriate points on the access plane. A supporting substrate formed of light transparent material such as silicon, is provided with suitable circuitry and bonding bumps on its face. A layer of insulation is applied to either the access plane or the substrate face, preferably the latter. The bonding bumps on the insulation-carrying surface are formed after the insulation has been applied. The substrate face is placed on the access plane of the stack, their bonding bumps being aligned and then bonded together under heat and pressure. A layer of thermally conductive (but electrically non-conductive) adhesive material is inserted between the substrate and stack. The substrate and stack combination is then placed and wire bonded in a protective container having leads extending therethrough for external connection. While this reference stands for a plurality of chips which are glued together with leads along one edge so that all leads of the stack are exposed on an access plane, it shows no transparent edge portions on the chips nor does it show a bonding means between pairs of chips which are in registry with a transparent edge portion. In addition, it appears that the chips are glued together by introducing epoxy between chips and curing it with heat. The only reference to light transparent material is used in connection with an access plane which is transparent to infra-red radiation. In the reference, a silicon access plane is utilized because it is transparent to infra-red light which is used to carry out a bump bonding process. There is no indication that light curable bonding means are cured by transmission through a window or edge portion on each chip.

SUMMARY OF THE INVENTION

The present invention relates to a three-dimensional package for integrated circuit electronics. The package comprises a plurality of subassemblies or fillo-leafs made of materials such as silicon, germanium, gallium arsenide, sapphire or lithium niobate. The fillo-leafs are bonded together at a transparent edge portion by an ultra-violet light curable material and extend in cantilever fashion from the bonded edge. The fillo-leafs carry integrated circuits like CMOS circuits, silicon-on-sapphire, superconducting Josephson circuits and fiber optic circuits. Whatever the technology used, all of them feature data transmission lines which extend from the circuits used to the bonded edges of the fillo-leafs. Some of these are the usual data, address and power lines. Pairs of lines called encoder lines are connected to a comparator and extend to the bonded edges of the chips. Once the stack of fillo-leafs is formed, the bonding edges are polished exposing, inter alia, the tips of the encoder lines and providing a planar surface. Thin film conductors are then formed on the surface among which are shorting straps or interconnections which either short-circuit pairs of encoder lines or leave them open. In this way, current either flows in a pair of encoder lines or it does not providing a unique digitally coded address for each fillo-leaf in a stack of such leafs. Each leaf in a stack or module of one-thousand leafs may be encoded permitting leafs, the operating status of which has been determined by testing, to be by-passed or selected pursuant to a stored program. Other lines formed on the edge portions carry out known functions and may be connected via interconnections to a flexible connector to the outside which provides signal or data and power. The fillo-leafs in the resulting package may be flexible or rigid and are cooled by a fluid coolant. Each leaf may carry logic circuits or memory arrays or combinations of both and stacks or modules of ganged fillo-leafs may be diced from wafers to provide massively parallel data processors.

The three-dimensional module assembly and its subassemblies are fabricated starting at the wafer level where a plurality of fillo-leafs are formed on each wafer with encoder and transmission lines of each fillo-leaf extending to one edge thereof. The wafers are subjected to a thinning step so that the wafer, when diced, provides flexible fillo-leafs. The wafer then has a heat dissipating element formed on its underside. After this, it is masked and a window, transparent to ultra-violet light, is formed at an edge of each fillo-leaf by oxidation or, in the instance of a sapphire substrate, by masking with the heat dissipating element. A wafer is then aligned to a common fixed reference using alignment marks on the wafer. An ultra-violet light curable material is spread on the wafer and another wafer aligned over it. Ultra-violet light is beamed at the wafer such that it passes through the U.V. transparent windows curing the light curable material in registry with the windows. The uncured material is later removed. After the desired number of wafers has been stacked, the wafer stack is diced into a plurality of fill-leaf modules each consisting of a plurality of fillo-leafs. Each module is then polished on the bonded edge and interconnects formed which include shorting straps for selected pairs of encoder lines which provide a unique address for each fillo-leaf. Once these interconnections have been formed, one or more interconnect levels incorporating vias may be fabricated with the last level connecting to data and power sources.

BRIEF DESCRIPTION OF THE DRAWINGS

FIG. 6 is a partially schematic top view of a fillo-leaf showing pairs of encoder lines and address lines extending from the outer edge of a fillo-leaf to a comparator circuit. FIG. 6 also includes a side-view of a plurality of fillo-leafs which indicates how each fillo-leaf is uniquely encoded.

DESCRIPTION OF PREFERRED EMBODIMENTS

Figure 1:
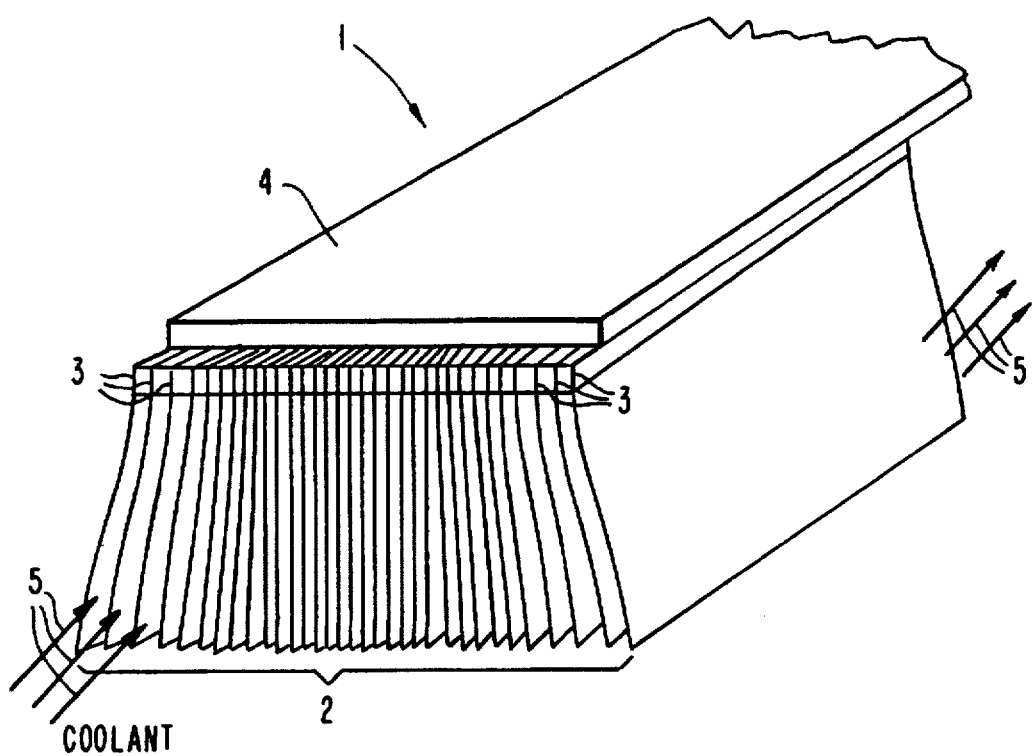
FIG. 1 is a perspective view of an MFT (Massive Fillo-Leaf Technology) module.

Referring now to FIG. 1, there is shown a perspective view of an MFT (Massive Fillo-Leaf Technology) module. In FIG. 1, module 1 includes a plurality of elements hereinafter also characterized as fillo-leafs 2 which are bonded together at their edges 3 so that fillo-leafs 2 extend in a cantilevered fashion from bonded edges 3. Each fillo-leaf 2 supports a plurality of pairs of electrically or light conductive lines (not shown) which extend from edges 3 to one or more comparators (not shown) forming a portion of the Massive Selection Architecture (MSA) which, as will be shown in more detail hereinbelow, permits the selection of a desired fillo-leaf 2 from among thousands of such fillo-leafs. Fillo-leafs 2 also include a first plurality of electrically conductive or light conductive lines (not shown) which feed address signals to the comparator mentioned above. If the address signals match the specifically coded address of a fillo-leaf 2, a circuit area (not shown) on a fillo-leaf 2 is activated by a signal from the comparator. As will be shown in detail hereinafter, each fillo-leaf 2 is provided with its own unique coded address in the form of strapped or unstrapped pairs of lines. Then, when address signals are provided to each of the fillo-leafs 2 simultaneously, only the comparator associated with the addressed fillo-leaf 2 will provide a selection signal to activate a circuit area on that fillo-leaf 2. Each fillo-leaf 2 supports an additional plurality of electrically conductive or light conductive lines (not shown) which carry data, memory selection information and power to a logic circuit area or memory array disposed on fillo-leaf 2 once a circuit area or array has been activated by a signal from the comparator. This additional plurality of lines extends from the active devices of a circuit or array to edge 3 of each element or fillo-leaf 2. In FIG. 1, all signals and required power for module 1 are brought to edges 3 of fillo-leafs 2 via a flat interconnection cable 4 or other appropriate interconnection medium. Arrows 5, in FIG. 1, represent coolant in the form of air or other appropriate cooling fluid which can flow among fillo-leafs 2 to remove heat generated by the operation of circuits in the various circuit areas of each of fillo-leafs 2.

Fillo-leafs 2, in FIG. 1, may be made, for example, from semiconductor wafers which have been thinned by chemical-mechanical polishing to such an extent that, when diced, they are very flexible. An appropriate semiconductor material such as silicon, germanium or gallium arsenide or other III–V compound semiconductor may be utilized to form fillo-leafs 2. It should be appreciated, however, that elements 2 may be made from insulating material such as sapphire and that semiconductor devices may be formed in juxtaposition with a surface thereof in a manner well-known to those skilled in the semiconductor arts. Similarly, elements 2 may be made from a material such as lithium niobate which is used in the fabrication of optical switching devices. Optical switching devices may be imbedded in the lithium niobate in the form of titanium dioxide lines portions of which are rendered transmissive or nontransparent to light by the application of electric fields in a well known way. Also, Josephson junction devices and circuits may be disposed in juxtaposition with the surface of a material such as silicon to form the elements or fillo-leafs 2 shown in FIG. 1. Any material which can carry or contain switchable devices, storage devices or logic circuits may be used in the practice of the present invention. Indeed, even a metal may be used for element 2 provided the switchable devices and circuits are disposed in insulated spaced relationship with it. For exemplary purposes in the remainder of the specification, however, fillo-leafs 2 will be considered to be made of silicon elements which contain logic and memory devices and circuits utilized in the operation of electronic computers. The semiconductor wafers from which fillo-leafs 2 are formed are provided with one or more active circuit areas in the form of logic circuits or memory arrays or both already formed on one surface of the semiconductor wafer. The circuit designs for each of the semiconductor wafers are such that all desired connections, whether input, output or power transmission lines, are brought to an edge 3 of each fillo-leaf 2 when the wafers are diced. This is an edge 3 which together with the edges 3 of a plurality of fillo-leafs 2 will ultimately be bonded together in a stack to form a major portion of module 1. In addition to the active circuit areas, each fillo-leaf 2 contains a comparator which, as indicated hereinabove, is used to provide activation signals to one or more circuit areas on each of fillo-leafs 2. While not shown in FIG. 1, each fillo-leaf 2 includes a circuit layer portion approximately 5 µm thick in which the active circuit areas are disposed. Another portion of each fillo-leaf is a substrate portion which acts as a mechanical support to resist breakage during handling. In addition, the underside of the substrate accommodates a thin copper layer which may have a waffle-iron morphology to conduct heat generated in the circuit areas to a coolant medium. This well known expedient is utilized because copper has a higher thermal conductivity than that of silicon. Indeed, any appropriate material such as diamond which has a higher thermal conductivity than silicon and is compatible with semiconductor processing may be utilized for this purpose.

Figure 2:
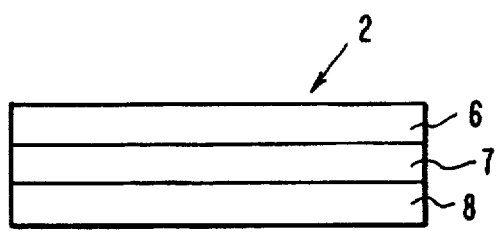
FIG. 2 is a cross-sectional view of a fillo-leaf after it has been subjected to a thinning process and a layer of copper has been deposited on the substrate portion thereof and after it has been diced from a semiconductor wafer.

FIG. 2 is a cross-sectional view of a fillo-leaf 2 after it has been subjected to a thinning process and a layer of copper has been deposited on the substrate portion thereof and after it has been diced from a semiconductor wafer. In FIG. 2, fillo-leaf 2 consists of a circuit layer 6, a substrate portion 7 and a deposited layer of copper 8. Layer 6 includes one or more circuit areas which, as indicated above, may include logic circuits or memory arrays or combinations of both types of circuits. Prior to forming fillo-leafs 2 by dicing, the semiconductor wafer from which they are cut in relatively thick so it is subjected to a well-known chemical-mechanical polishing technique on its underside which reduces the thicknesses of substrate portions 6 to the extent that each fillo-leaf 2, when diced from the semiconductor wafer, is flexible but is not so thin that handling during future processing is not possible. Once the desired thickness of substrate portion 7 has been reached, the semiconductor wafer is subjected to a copper deposition process which forms a deposited layer of copper 8 on substrate portion 7 of each fillo-leaf 2. Again, the thickness of copper layer 8 is not so thick that the flexibility of a fillo-leaf 2, when diced from a wafer, is compromised. Copper layer 8 may be subjected to further processing using well known photolithographic and etching techniques to increase the surface area of layer 8 thereby rendering the cooling of module 1 more efficient. One approach which increases the surface area of copper layer 8 is to deposit a layer of copper on the underside of a semiconductor wafer; form masked areas; deposit copper over exposed and masked areas and lift-off the masked area masks. This leaves a copper film having a waffle iron-like shape which has a larger cooling surface.

Of course, where element 2 is made of a material such as sapphire and the circuit devices are disposed on a surface of the sapphire, there is no circuit layer 6 as such, but only a substrate portion 7 which comprises element 2. In this situation, element 2 would have been subjected to a chemical-mechanical polishing step to thin the parent wafer and to the formation of a heat dissipating layer on each fillo-leaf 2. The resulting fillo-leafs 2 would then be flexible. However, if desired, the wafer need not be thinned and the resulting fillo-leaf 2, relative to a flexible one, would be rigid.

Figure 3:
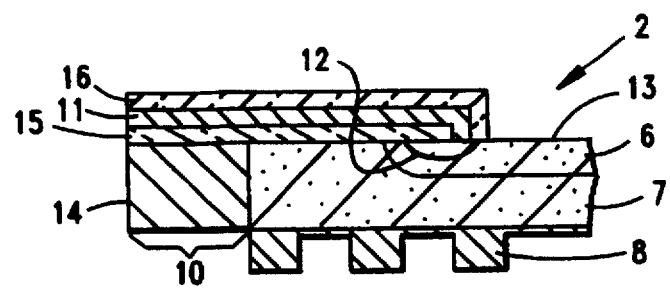
FIG. 3 is a cross-sectional view of a portion of a fillo-leaf or element wherein a conductive line extends from an active circuit device in insulated spaced relationship with the surface and edge portion of a fillo-leaf.

Referring now to FIG. 3, there is shown a cross-sectional view of a portion of a fillo-leaf or element 2 wherein a conductive line extends from an active circuit device in insulated spaced of relationship with the surface and edge portion of fillo-leaf or element 2.

Once the wafers have been processed as described above, they are stacked, spaced, aligned and bonded so that the ends of conductive lines disposed at edges 3 such as address lines and codable address lines may be placed in precise alignment.

In FIG. 3, the same reference characters used in previous Figs, identify the same elements. Thus, element 2 includes a circuit layer 6, a substrate portion 7 and a layer 8 made of copper having a waffle iron-like morphology. In addition, element 2 includes an edge portion 10 which is an oxidized portion of element or fillo-leaf 2 and has the same thickness as element 2. In FIG. 3, a conductive line 11 extends from a semiconductor region 12 over a surface 13 of element 2 and terminates on the outer edge 14 of edge portion 10. Line 11 is insulated from surface 13 by a layer 15 of silicon dioxide or other appropriate insulating material. Layer 15 extends over edge portion 10 and, like line 11, terminates at outer edge 14. In a similar way, passivation layer 16 extends from semiconductor region 12, over line 11 and terminates at outer edge 14. Edge portion 10 is conveniently made from silicon dioxide which may be grown at the wafer level by masking the underside of the wafers and subjecting the exposed portions thereof to an oxidizing atmosphere while heating to provide oxidized regions in the wafer. When the wafer is diced, the oxidized regions will become edge portions 10 for fillo-leafs 2 providing the structure of FIG. 3. The dicing of a wafer to form fillo-leafs or elements 2 is accomplished in a well-known way and does not provide a smooth, planar edge 14 like that shown in FIG. 3. To the extent outer edge 14 is not of a desired smoothness and planarity, this will be taken care of after a plurality of fillo-leafs 2 are stacked, aligned and bonded. At that point, as will be described below, outer edges 14 are polished to provide a surface sufficiently planar to provide interconnections between pairs of conductive lines 11, on the same fillo-leaf 2, for example, (local wiring) or between conductive lines 11 on different fillo-leafs 2 (global wiring) on the same stack that are much longer.

Figure 4:
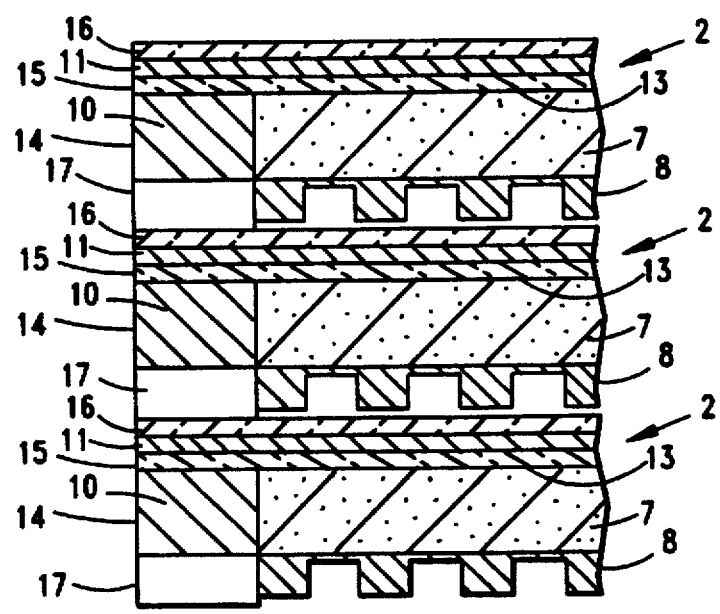
FIG. 4 shows a cross-sectional view of a plurality of fillo-leafs like that shown in FIG. 3, disposed in a stack.

In addition to providing an insulating surface on which thin film interconnections may be made locally and globally, edge portions 10 perform a key function during fabrication by acting as transparent regions or windows which are adapted to transmit electromagnetic radiation, specifically, ultra-violet light, which is used to cure a bonding material disposed between edge portions 10 when elements 2 are stacked. FIG. 4 will show a stacked assembly of fillo-leafs 2 which incorporate both the windows and light curable material. Also, edge portions 10 may contain solder bump connection points from which conductive lines extend to circuit areas or memory arrays to permit circuit testing. Circuit testing would be carried out on the wafer level prior to dicing.

While not specifically shown in FIG. 3, it should be appreciated that circuit layer 6 may contain logic circuits or memory arrays made up of active circuit devices like transistors, diodes and the like. More specifically, bipolar circuits and low-power circuits incorporating CMOS devices may be utilized. Also, well-known memory arrays incorporating one-device memory cells may be utilized in forming such arrays in fillo-leafs 2. Also, while only a single conductive line 11 has been shown in FIG. 3, it should be appreciated that a plurality of conductive lines terminate at outer edge 14 and that these lines function to encode each fillo-leaf 2 with its own unique address; receive address information from address lines and bring data and power to the addressed fillo-leaf 2.

FIG. 4 shows a cross-sectional view of a plurality of fillo-leafs like that shown in FIG. 3 disposed in a stack.

In FIG. 4, the same reference characters as used in previous Figs. identify the same elements. Elements 2 which may be characterized as module subassemblies for module assembly 1 shown in FIG. 1 are identical with fillo-leaf 2 shown in FIG. 3 except that the active devices in their circuit areas 6 may form logic circuits, memory arrays or combinations of both. Also, a bonding means 17 in FIG. 4 is not shown in FIG. 3. Bonding means 17, in FIG. 4, extends between the bottom of each edge portion 10 and the top of passivation 16 of the adjacent underlying element. Bonding means 17, in FIG. 4, is in rigid form and is bonded to edge portions 10 and passivations 16 in such a way that the unoxidized portions of elements 2 extend in a cantilevered fashion from bonding means 17. The latter are in registry with their overlying transparent windows formed by edge portions 10. As will be seen hereinafter, when each wafer is stacked on another, the bonding means which is made of an ultra-violet curable material such as DYMAX is disposed between a pair of wafers. Then, when properly aligned to a common fixed reference, ultra-violet light is beamed through edge portions 10 acting as windows and the light curable material in registry with portions 10 becomes rigid while bonding to edge portions 10 of elements 2. Since the bonding material outside of edge portions 10 is masked by copper films 8, bonding material there is not cured. It may then be washed away leaving bonding means 17 intact. To the extent that conductive lines 11 also shadow the light curable material, this is not a problem because the lines are thin enough that the curing ultra-violet light is scattered enough to permit the whole of bonding means 17 to be cured. If line thickness creates a problem in curing, the curing light may be obliquely beamed through end portions 10 to insure proper curing of bonding means 17. During stacking, the thickness of the light curable material is adjusted so the bottoms of thin metal films 8 do not touch passivations 16 beneath them. There should be sufficient spacing between elements 2 to permit the flow of a cooling fluid between elements 2. This is particularly true when elements 2 are rigid. In a flexible regime, spacing is less important because elements 2 are sufficiently flexible to move apart under coolant flow conditions. Contact between portions of fillo-leafs 2 would, in any event do little damage because, at worst, metal would always contact passivation or insulation.

Prior to bonding, testing of circuits in circuit areas 6 may be carried out at the wafer level, using solder ball interconnections on edge portions 10 and test interconnections which apply test routines to the various circuit areas to exercise their functions. It is, at this point, that information relating to the operability of each fillo-leaf 2 in stored so that appropriate coding can be provided on each fillo-leaf 2 after they are diced into stacks. It should be appreciated here that the present approach is so facile and useful and so many fillo-leafs 2 are available that even totally inoperable fillo-leafs 2 are included in a stack without significantly degrading performance. Encoding each fillo-leaf 2 makes it possible to select or avoid any fillo-leaf 2 in a stack.

When testing and bonding have been carried out, the stacked wafers are subject to a dicing step which provides a stack of fillo-leafs 2 like that shown in FIGS. 1, 4. Multiple stacks of fillo-leafs 2 may be provided by slicing at end portions 10 permitting a plurality of stacks to be connected together via an interconnection cable 4.

Once stacks of fillo-leafs 2 have been produced by dicing, outer edges 14, bonding means 17, passivations 16, oxides 15 and lines 11 of such stacks are subjected to a chemical-mechanical polishing step, in a well-known way, to bring these elements to the same level. In this way, a substantially planar surface is provided with the ends of lines 11 being exposed so that local and global interconnections among fillo-leafs 2 can be made. These interconnections may be formed by masking and etching a deposited thin film of metal in a well-known way on outer edges 14 which are insulating in character. Electrical contact is made directly to lines 11 during deposition. Otherwise, an oxide layer may be deposited, using a mask such that lines 11 and other areas are masked. When the mask is removed vias remain into which solder balls are formed. Thin film interconnections are then deposited including, as well be shown in connection with FIG. 5, shorting straps which encode each fillo-leaf 2.

Then, flat interconnection cable 4, as shown in FIG. 1, may be connected to the solder balls on outer edges 14 via corresponding solder balls on the surface of interconnection cable 4.

Figure 5:
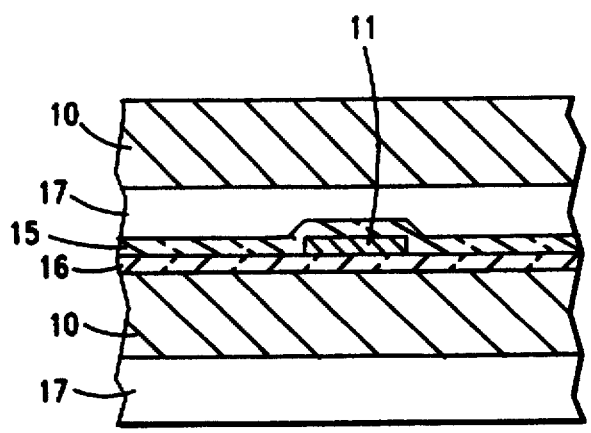
FIG. 5 is a cross-sectional view through edge portions of FIG. 4 showing a conductive line and a bonding means sandwiched between a pair of edge portions.

FIG. 5 is a cross-sectional view through edge portions of FIG. 4 showing a conductive line and a bonding means sandwiched between a pair of edge portions. FIG. 5 shows transparent edge portions 10 extending over lines 11 and bonding means 17 conforming to the topology of the surface on which it is placed. In this instance, the surface is that of passivation 16 which itself is conformal with line(s) 11 over which it passes. In FIG. 5, the end of conductive line 11, by virtue of a chemical-mechanical polishing step, is bare and surrounded by insulation in the form of oxide 15 and passivation 16.

It should now be clear that thin film wiring may be placed on the now polished surface of edge portion 10 and that local wiring may be made to other conductive lines 11 on the some fillo-leaf 2. It should also be clear that global wiring may be made from conductive lines 11 on a selected fillo-leaf 2 to conductive lines 11 on fillo-leafs 2 above and below the selected one. As will be shown in what follows, the ability to provide local wiring allows one to encode each fillo-leaf 2 with a unique address code which will permit the selection of that fillo-leaf 2 from hundreds or even thousands of such fillo-leafs 2. This is characterized as Massive Selection Architecture (MSA) which is described below in conjunction with FIG. 6.

FIG. 6 is a partially schematic top view of a fillo-leaf showing pairs of encoder lines and address lines extending from the outer edge of a fillo-leaf to a comparator circuit. A circuit layer which may contain logic circuits or memory arrays is shown disposed in a fillo-leaf and conductive lines which carry data, power and other required information are shown extending from the outer edge of the fillo-leaf to the circuit layer. FIG. 6 shows a side-view of a plurality of fillo-leafs which indicates how each fillo-leaf is uniquely encoded.

Fillo-leafs 2 in FIG. 6, while shown therein in schematic form, are exactly like those shown in the previous Figs. Certain details have been removed to simplify the following explanation. Thus, only edge portion 10 has been shown to provide a positional reference for the top view and only conductive lines 11 have been shown in the side view to clearly show the encoding of pairs of encoder lines on outer edges 14 of fillo-leafs 2. Also, to distinguish the encoder lines from address lines and from data and power transmission lines and all three from conductive lines 11, each of the different lines will be shown in what follows by different reference numbers. Thus, in FIG. 6, lines 20, 21 are pairs of encoder lines, lines 22 are address lines and lines 23 are data and power transmission lines. Circuit area 6 is shown in the top view of fillo-leaf 2 as a block. It should be appreciated that this layer may be comprised of logic circuits, memory arrays or combinations of both. However, whatever the combinations may be, all lines servicing each fillo-leaf 2 will extend to outer edge 14 of each fillo-leaf 2.

Considering now the top view of FIG. 6, pairs of encoder lines 20, 21 are shown extending from edge 14 of fillo-leaf 2 over edge portion 10. Line 20 of each pair is shown connected to the gate electrode 24 of an associated field effect transistor 25. Line 21 of each pair is shown connected to a power source 26. A drain electrode 27 of each transistor 25 is connected to ground and a source electrode 28 of each transistor 25 is connected to a comparator circuit indicated in FIG. 6 by block 29. An output line 30 extends from comparator block 29 to circuit area 6. Line 30 provides an enabling or selection signal which actives either the logic circuits or memory circuits in area 6 when an address sent to all fillo-leafs 2 coincides with the coding on a fillo-leaf 2. Coding is accomplished by applying or not applying shorting straps 31 across pairs of encoder lines 20, 21 during the metallization of outer edges 14 described in FIG. 4. In FIG. 6, shorting straps 31 are shown connected in the top view, across the first and third pairs of encoder lines 20, 21 from the top on outer edge 14. Note that the second and fourth encoder lines 20,21 from the top are left open. Shorting straps 31 connect power to gates 24 of the first and third transistors 25 from the top, activating them and permitting current to flow to selected devices in a comparator circuit 29. This coding is permanent and different for each fillo-leaf 2 and transistors 25 may be powered from either a fixed or clocked source of power. Then, when address signals are applied to all fillo-leafs 2 in parallel via address lines 22, the address signals are conveyed to comparator 29 where, if a match between the coding signals of a fillo-leaf 2 and the address signals occurs, an enabling signal will be sent via line 30 to circuit area 6. In FIG. 6, if a strapped pair of encoder lines 20, 21 represents a digital "1" and an unstrapped pair a digital "0", the code for fillo-leaf 2 in the top view of FIG. 6 is 1010. If the address on address lines 22 is also 1010, then a comparison will be made and an output will appear on line 30.

The side view in FIG. 6 shows a stack of fillo-leafs 2 which are bonded together at their edge portions 10 and present their outer edges 14 in the plane of the paper. The rightmost column of pairs of encoder lines 20, 21, shown in side view, correspond to the pairs of encoder lines 20, 21 shown in the top view of FIG. 6. Shorting straps 31 in the side view in the rightmost column also correspond to straps 31 shown in the top view providing the coding 1010. The leftmost column shows straps 31 shorting all the pairs of encoder lines 20, 21 providing a code of 1111. The middle column straps 31 shorting all encoder lines 20, 21 but the second from the top, provide a code for its associated fillo-leaf 2 of 1011. When address lines 22 carry the address signals 101 1, comparator 29 on that fillo-leaf 2 will provide an output on its associated line 30 activating its associated circuit area 6.

While lines 23 have been characterized as data and power transmission lines, it should be appreciated that these lines are the ones that carry input and output data, x,y selection and the like. Lines 22, 23 are global in character since they are connected to more than one fillo-leaf 2. Address lines 22 must be connected to all fillo-leafs 2. Shorting straps 31, since they interconnect conductive lines 11, like pairs of encoder lines 20, 21, in the same fillo-leaf 2, may be characterized as local wiring. In a more general sense, wiring may be characterized as global, regardless of the number of fillo-leafs 2, it extends over, if it is over 10 mm in length. If it is less than 10 mm, specifically 10–14 µm, it is local wiring. Local wiring of these short lengths may be deposited directly on the polished edge portions while global wiring, since it must have adequate signal propagation characteristics to retain the TEM mode, may require other approaches.

To form modules 1 of FIG. 1, fabrication begins at the wafer level. For exemplary purposes, will be assumed that appropriate logic circuits, memory array and other circuit elements have been formed in semiconductor circuit areas 6 each of which will become a fillo-leaf 2 in a stack when a stack of wafers is diced. Each fillo-leaf or element 2 will look like the arrangement shown in FIG. 6. Fillo-leafs 2 will have been fabricated using techniques well-known to those skilled in the semiconductor arts and each fillo-leaf 2 will have been positioned relative to alignment references disposed on each wafer. In addition, edge portions 10 which have been formed in the wafer will become the edges of fillo-leafs 2. This can be accomplished preferably by masking the underside of a wafer and exposing selected portions using well-known photolithographic techniques. An etchant is then used to etch the exposed portions are then subjected to a low temperature oxidation step to oxidize these regions completely. The resulting oxidized portion will become edge portions 10 when the wafer is diced to produce stocks of fillo-leafs 2. To minimize slicing, back to back semiconductor regions can be oxidized so that a single slicing operation forms edge portions 10 of two stacks of fillo-leafs 2.

In the next step in the fabrication process, wafers are thinned using a chemical-mechanical polishing technique on the underside of each wafer to a thickness of approximately 10 mm or less. An etchant such as HF may be used in the chemical-mechanical polishing step. Of course, the upper surface of each wafer is appropriately masked to protect solder in via holes, for example, which is present to permit circuit testing at the wafer level.

After the wafer has been thinned, a copper layer is deposited on the underside of each wafer and processed as described hereinabove, to give it a waffle iron-like shape for heat dissipation purposes. Following this step, the oxidized semiconductor regions which will become edge portions 10 of fillo-leafs 2 are masked to prevent deposition on their undersides since nothing must impede their transparency when stacked.

Apart from its heat dissipation function when a material like sapphire is used for a fillo-leaf 2, the deposited copper layer acts on a mask when ultra-violet light is projected through its end portion. As will be seen below, bonding material is flowed between pairs of fillo-leafs 2 so some provision must be made to prevent curing of the bonding material in areas outside end portion 10. The copper film provides this additional function. Of course, where the wafers are not transparent, the copper film functions only as a heat dissipating member.

In the next step, wafers are aligned, stacked and bonded in serial fashion until the desired number of wafers are stacked. Using the alignment masks disposed on each wafer, a wafer is aligned to a common fixed reference. In this way, each fillo-leaf 2 in a stack is positioned over a similar fillo-leaf 2 on the wafer below it with a high degree of accuracy since each fillo-leaf 2 has been positioned relative to alignment marks on each wafer. At this point, an ultra-violet curable material is flowed onto the surface of a wafer. The amount used, of course, will determine the thickness of this material. Then, another wafer is aligned with the common fixed reference and placed on the light curable material. The wafer is then exposed to ultra-violet light and a portion of it is transmitted via transparent edge portions 10 to the light curable material under it. Exposure is carried out for a time sufficient cure the thus exposed material. Ultra-violet fixable conformal coatings such as DYMAX Line 84F and DYMAX Line 84LVF which are commercially available from DYMAX Corporation may be used. Appropriate cleaning and degreasing of the wafers is of course, required to insure adhesion of the cured material to edge portions 10.

The thus cured material now disposed in registry with edge portions 10 is bonding means 17 found in FIG. 4. The foregoing steps are carried out in serial fashion as many times as are required to stack the desired number of wafers. The resulting stacks may include several hundreds of wafers.

Since the wafers are bonded to edge portions 10, the stack of wafers is diced along selected lines so that single or multiple stacks of fillo-leafs 2 are provided. Because of the dicing, outer edges 14 of edge portions 10 are exposed. Outer edges 14 all form a substantially planar surface with only the tips of interconnection lines 10 being exposed at an otherwise electrically insulating surface. To the extent that outer edges 14 are marred by the dicing process, edge portions 10 are subjected to a chemical-mechanical polishing step which render outer edges 14 planar and polished. The polishing step also insures that interconnection lines 11 are exposed of subsequent bonding to thin film wiring which will be deposited on edge portions 14. Before thin film wiring is provided, the pattern of interconnections is captured photographically or otherwise stored. There will be some alignment differences, however small, between the various layers. The captured patterns are used to generate a mask which will provide a customized wiring pattern which accounts for the above mentioned alignment errors. The formation of thin film wiring then proceeds in the usual fashion which includes photolithographically masking and etching a previously deposited metallic layer. This layer of metallization can then be covered with an insulating film except for via-holes into which solder balls are formed to connect the thin film wiring to corresponding solder balls on interconnection cable 5. The latter, of course, provides all data, addresses and power to each of fillo-leafs 2. To enhance connectability, additional wiring layers may be formed in insulated spaced relationship over the first interconnection layer which was deposited on outer edges 14. This is a well-known expedient and it need not be explained here since it forms no part of the present invention. Attentively, instead of an interconnection cable 5, cards or boards may be utilized on to which a plurality of modules 1 may be soldered to form, for example, massively parallel data processors.

The above steps provide the module 1 of FIG. 1 which shows fillo-leafs 2 which are flexible in character. Though this is the preferred approach, fillo-leafs 2 may be rigid and more than one edge portion 10 may be utilized for bonding to insure rigidity of a stack of such fillo-leafs. Thus, for example, two opposing edges of a fillo-leaf 2 incorporate edge portions 10. Fillo-leafs 2 must then be spaced apart sufficiently to permit the flow of coolant between fillo-leafs 2. This is possible because uncured or unfixed ultra-violet cured material is removed from between fillo-leafs 2 once the curing step has been completed.

In a typical arrangement, a module 1 may contain one-thousand fillo-leafs 2 which each leaf 2 having dimensions of 10 mm×10 mm. With each fillo-leaf two containing four memory arrays storing 16 megabits, the stacks will store $(1,000 \times 4 \times 16) = 64$ Giga-bits in a volume of, for example, 10 $cm^3$ or less.

From the foregoing, it should be clear that fillo-leafs 2 may be made, as indicated hereinabove, of many different materials which permit both electrical and optical signals to be used. Thus, silicon-on-sapphire, Josephson junctions with silicon and optically switched devices may all be formed into modules 1 without departing from the spirit of the present invention.

What is claimed is:

1. A three dimensional module comprising:
   a plurality of elements disposed in registry in a stack, each of said elements carrying a plurality of active circuit devices,
   actuating means disposed on each said element for actuating said plurality of active circuit devices when matching first and second coded input signals are applied to said actuating means;
   means disposed at the edge of each said element connected to an associated means for applying first coded signals which are unique to each said element to said an associated means for actuating; and
   means disposed at the edges of said elements connected to each of said means for actuating for applying second coded signals to each of said means for actuating said active devices on one said elements.

2. The module according to claim 1, wherein each of said elements has a planar surface at least an edge portion of which is transparent to electromagnetic radiation.

3. A three dimensional module assembly comprising:
   a stack of fillo-leafs each of which contains a plurality of actuable circuit elements;
   a comparator circuit which includes a plurality of active devices disposed on each of said fillo-leafs which provides an actuating output to said plurality of actuable circuit elements when first and second coded inputs to said comparator match;
   encoding means disposed at an edge of each of said fillo-leafs connected to an associated comparator circuit each encoding means providing a first uniquely coded input to said an associated comparator circuit; and,
   means disposed at an edge of each of said fillo-leafs connected to each comparator for applying said second input to each comparator circuit to generate said output when said first and second coded inputs match.

4. A module according to claim 1 wherein each of said elements is a semiconductor.

5. A module according to claim 1 wherein each of said elements is sapphire.

6. A module according to claim 1 wherein each of said elements is an electrically insulating material.

7. A module according to claim 1 wherein each of said elements is silicon.

8. A module according to claim 1 wherein each of said elements is made of lithium niobate.

9. A module according to claim 1 wherein said active circuit devices are transistors.

10. A module according to claim 1 wherein said active circuit devices are memory cells.

11. A module according to claim 1 wherein said active circuit devices are logic circuits.

12. A module according to claim 1 wherein said means for actuating are comparator circuits.

13. A module according to claim 1 wherein said active circuit devices are switchable optical devices.

14. A module according to claim 1 wherein said active circuit devices are optical circuits.

15. A module according to claim 1 wherein said active circuit devices are Josephson junctions.

16. A module according to claim 1 wherein said active circuit devices are electrically switchable devices disposed in insulated spaced relationship with said elements.

17. A module according to claim 1 wherein each of said elements is made of III–V compound semiconductor materials and their alloys.

18. A module according to claim 1 wherein each of said elements is made of gallium arsenide.

19. A module according to claim 1 wherein each of said elements of is a metal.

20. A module according to claim 2 wherein said edge portion is an oxide of a metal.

21. A module according to claim 2 wherein said edge portion is an oxide of silicon.

22. A module according to claim 1 wherein said edge portion is a material transparent to electromagnetic radiation.

23. A module according to claim 2 wherein said edge portion is a material transparent to ultra-violet radiation.

24. A module according to claim 2 wherein said edge portion is an insulator transparent to electromagnetic radiation.

25. A module according to claim 1 further including a heat dissipating and spacing element disposed contiguously with the underside of each of said elements.

26. A module according to claim 1 further including a heat dissipating metal film having a waffle iron-like shape extending from the underside of each of said elements.

27. A module according to claim 1 further including a copper film disposed contiguously with the underside of each of said elements.

28. A module according to claim 1 wherein each of said elements is flexible.

29. A module according to claim 1 wherein each of said elements is rigid.

30. A module according to claim 1, wherein said means for applying first coded signals includes a plurality of pairs of encoder lines extending from said actuating means and terminating at said edge.

31. A module according to 1 wherein said means for actuating is a comparator circuit.

32. A module according to claim 1 wherein said active circuit devices are CMOS devices.

33. A module according to claim 1 wherein said means for applying second coded signals includes a first plurality of transmission lines extending over said element from said actuating means and terminating at said edge.

34. A module according to claim 1 further including a second plurality of data, address and power transmission lines extending over said edge to said plurality of active circuit devices and terminating at said edge.

35. A module according to claim 30 wherein said encoder lines are made of metal.

36. A module according to claim 30 wherein said encoder lines are made of heavily doped silicon.

37. A module according to claim 30 wherein said encoder lines are passivated with an oxide of silicon.

38. A module according to claim 30 wherein said encoder lines are optical transmission lines.

39. A module according to claim 30 wherein said encoder lines are made of titanium dioxide.

40. A module according to claim 31 further including a plurality of pairs of encoder lines extending from said edge to said comparator circuit, and, means disposed perpendicular to at least a pair of encoder lines and adjacent to said edge for applying a short circuit to said at least a pair of encoder lines for applying said first coded signals to said comparator circuit.

41. A module according to claim 33 wherein said transmission lines are electrically conductive.

42. A module according to claim 33 wherein said transmission lines are optical fibers.

43. A module according to claim 34 wherein said data, address and power transmission lines are electrically conductive.

44. A module according to claim 34 wherein said data, address and power transmission lines are optical fibers.

45. The module according to claim 30, wherein said means for applying first coded signals further includes means disposed at said edge for applying a short circuit to at least one of said plurality of pairs of encoder lines.

46. A module according to claim 45 wherein said means for applying a short circuit is a shorting strap interconnecting said at least a pair of said plurality of pairs of encoder lines.

* * * * *